United States Patent
Xiong et al.

(10) Patent No.: US 11,036,579 B2
(45) Date of Patent: Jun. 15, 2021

(54) DECODER FOR MEMORY SYSTEM AND METHOD THEREOF

(71) Applicant: SK hynix Inc., Gyeonggi-do (KR)

(72) Inventors: Chenrong Xiong, San Jose, CA (US); Aman Bhatia, San Jose, CA (US); Fan Zhang, San Jose, CA (US); Naveen Kumar, San Jose, CA (US); Xuanxuan Lu, San Jose, CA (US); Yu Cai, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/432,305

(22) Filed: Jun. 5, 2019

(65) Prior Publication Data
US 2019/0377635 A1    Dec. 12, 2019

Related U.S. Application Data

(60) Provisional application No. 62/681,431, filed on Jun. 6, 2018.

(51) Int. Cl.
| | | |
|---|---|---|
| *G06F 11/10* | (2006.01) | |
| *H03M 13/37* | (2006.01) | |
| *H03M 13/11* | (2006.01) | |
| *G11C 29/52* | (2006.01) | |

(52) U.S. Cl.
CPC .......... *G06F 11/1068* (2013.01); *G11C 29/52* (2013.01); *H03M 13/1105* (2013.01); *H03M 13/3746* (2013.01)

(58) Field of Classification Search
CPC ......... H03M 13/3723; H03M 13/3746; H03M 13/1105; G06F 11/1072; G06F 11/1068; G11C 29/44; G11C 29/52

See application file for complete search history.

(56) References Cited

U.S. PATENT DOCUMENTS

| | | | |
|---|---|---|---|
| 9,183,085 B1* | 11/2015 | Northcott | G06F 11/1012 |
| 2013/0145238 A1* | 6/2013 | Alhussien | H03M 13/1154 714/786 |
| 2014/0173380 A1 | 6/2014 | Wu et al. | |
| 2014/0281819 A1* | 9/2014 | Wood | G06F 11/1048 714/773 |
| 2016/0006462 A1 | 1/2016 | Hanham et al. | |
| 2017/0004037 A1* | 1/2017 | Park | G06F 11/1068 |

OTHER PUBLICATIONS

Karakulak et al., "Read Level Profiling Algorithms for NAND Based SSD Flash," Dec. 1, 2016 ; 2016 IEEE Global Communications Conference (GLOBECOM) (pp. 1-6) (Year: 2016).*

* cited by examiner

*Primary Examiner* — Guy J Lamarre
(74) *Attorney, Agent, or Firm* — IP & T Group LLP

(57) ABSTRACT

Decoder is provided for memory systems. The decoder receives data from a memory device including a plurality of pages, each storing data, and decoding the data based on a type of a page in which the data is stored, among the plurality of pages and life cycle information indicating a current state of the memory device in its life cycle.

17 Claims, 10 Drawing Sheets

PG : PARAMETER GROUP

DECODER FOR MEMORY SYSTEM AND METHOD THEREOF

CROSS-REFERENCE TO RELATED APPLICATION

This application claims the benefit of U.S. Provisional Application No. 62/681,431, filed on Jun. 6, 2018, the entire contents of which are incorporated herein by reference.

BACKGROUND

1. Field

Embodiments of the present disclosure relate to a decoding scheme for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various kinds of encoders and decoders.

SUMMARY

Aspects of the present invention include a memory system including a decoder capable of improving error correction performance and reducing decoding latency.

In one aspect, a system includes a memory device including a plurality of pages, each storing data, and a controller including a decoder. The controller receives data from the memory device, and decodes the data based on a type of a page in which the data is stored, among the plurality of pages and life cycle information indicating a current state of the memory device in its life cycle.

In another aspect, a method for operating a system including a memory device which includes a plurality of pages, each storing data. The method includes receiving data from the memory device and decoding the data based on a type of a page in which the data is stored, among the plurality of pages and life cycle information indicating a current state of the memory device in its life cycle.

Additional aspects of the present invention will become apparent from the following description.

DETAILED DESCRIPTION

Figure 1:
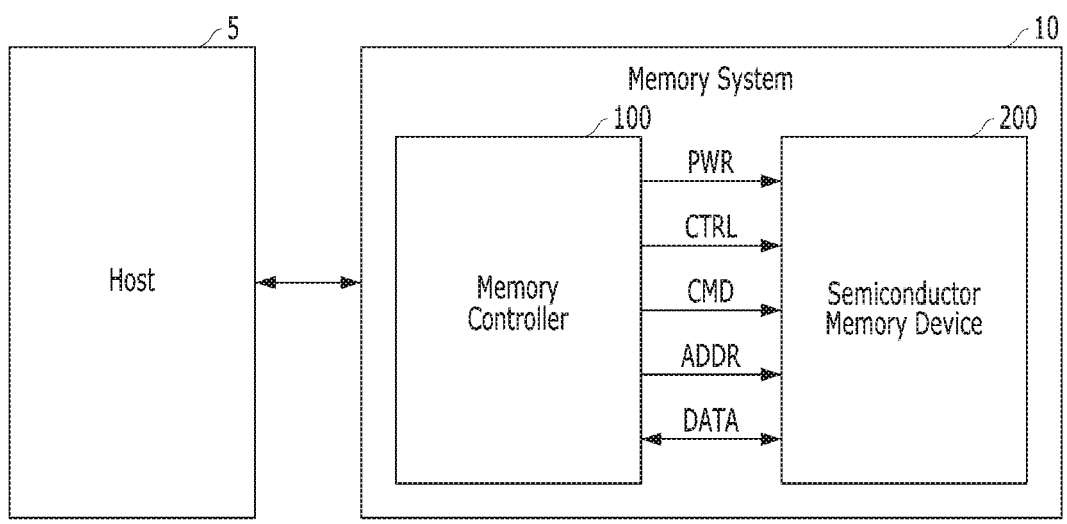
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200, sometimes referred to below as simply a memory device. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
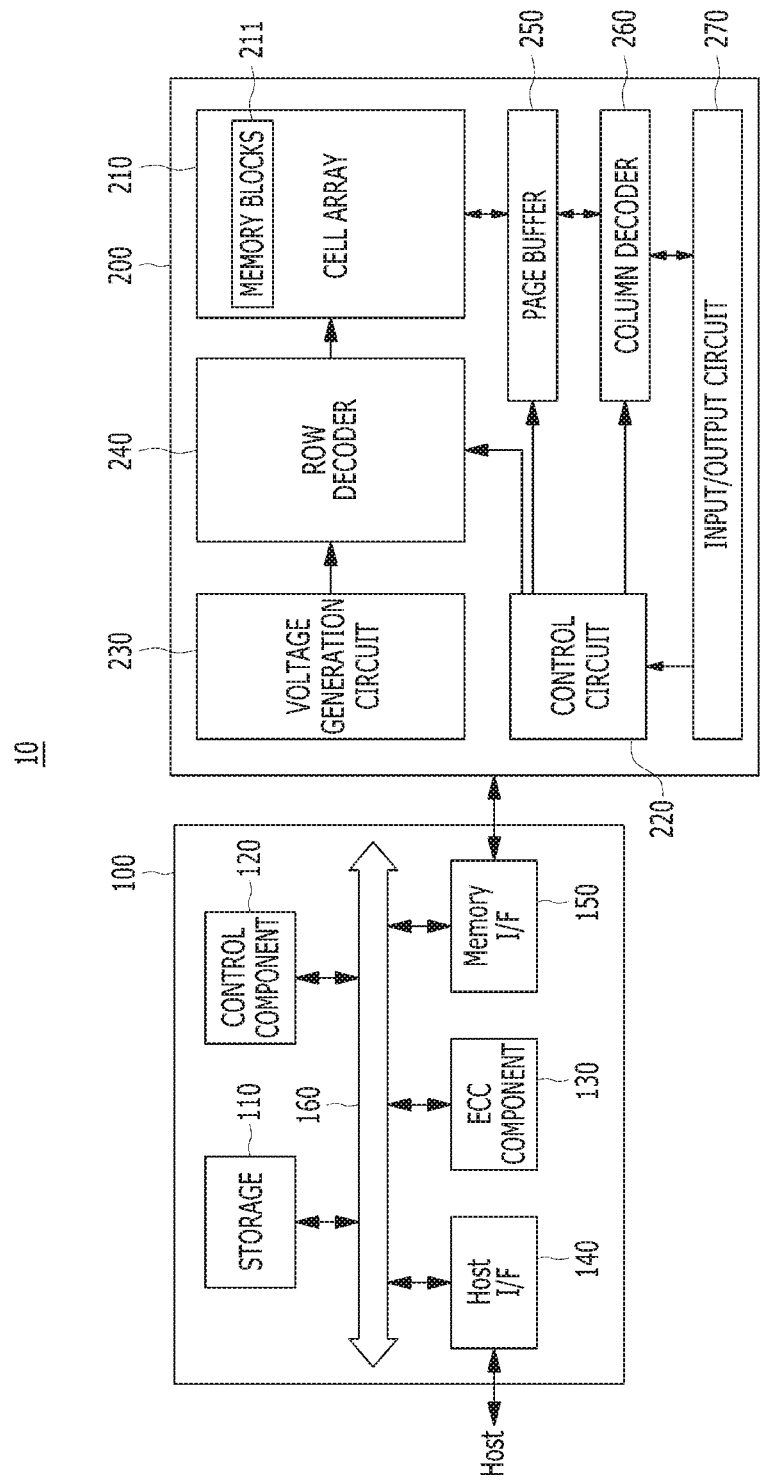
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
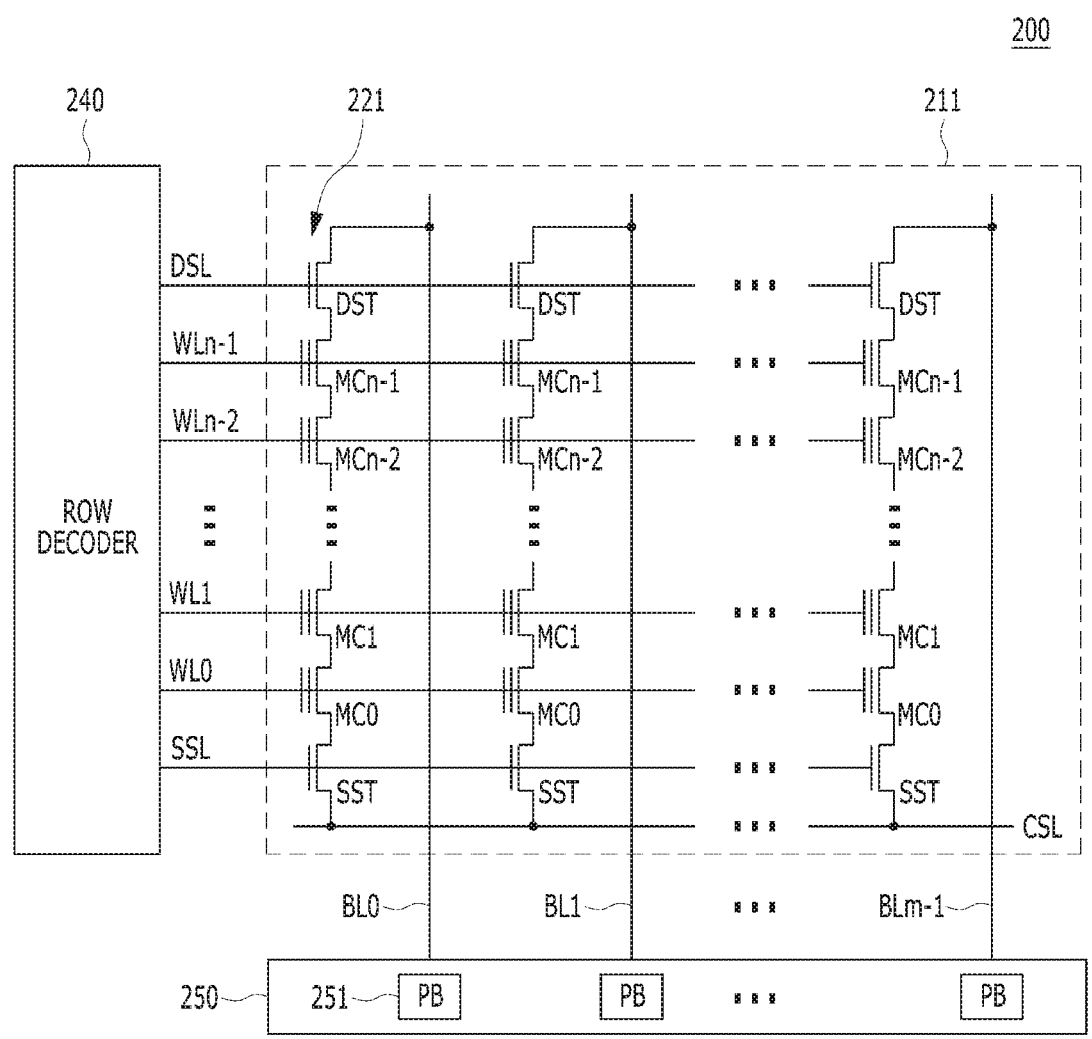
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1.

The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include NAND-type flash memory cells. However, the memory blocks 211 are not limited to such cell type, but may include NOR-type flash memory cells. Memory cell array 210 may be implemented as a hybrid flash memory in which two or more types of memory cells are combined, or one-NAND flash memory in which a controller is embedded inside a memory chip.

Memory devices such as a flash memory may store multiple bits per cell by modulating the cell into different states or voltage levels using a programming operation.

Figure 4:
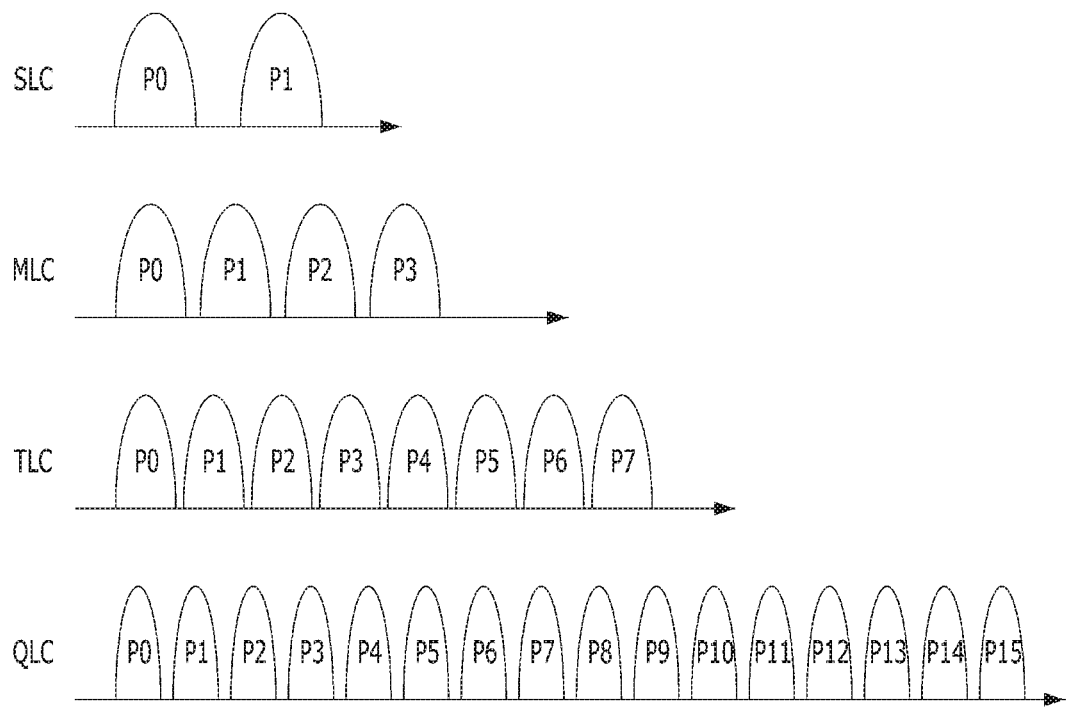
FIG. 4 is a diagram illustrating distributions of states for different types of cells of a memory device.

FIG. 4 is a diagram illustrating distributions of program states or voltage (PV) levels for different types of cells of a memory device.

Referring to FIG. 4, each of memory cells of the memory blocks may be implemented with multiple level cells, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

Each SLC may include two states P0 and P1. P0 may indicate an erase state, and P1 may indicate a program state. Since the SLC can be set in one of two different states, each SLC may program or store 1 bit according to a set coding method. Each MLC may include four states P0, P1, P2 and P3. Among these states, P0 may indicate an erase state, and P1 to P3 may indicate program states. Since the MLC can be set in one of four different states, each MLC may program or store two bits according to a set coding method. Each TLC may include eight states P0 to P7. Among these states, P0 may indicate an erase state, and P1 to P7 may indicate program states. Since the TLC can be set in one of eight different states, each TLC may program or store three bits according to a set coding method. Each QLC may include 16 states P0 to P15. Among these states, P0 may indicate an erase state, and P1 to P15 may indicate program states. Since the QLC can be set in one of sixteen different states, each QLC may program or store four bits according to a set coding method.

Currently, multi-level cell (e.g., MLC, TLC, QLC) data coding is widely used for a memory device (e.g., NAND flash memory) to increase the capacity of a memory system such as SSD. A wordline of a memory device includes multiple logic pages. For example, a wordline of MLC memory has two logic pages: a most significant bit (MSB) page and a least significant bit (LSB) page. A wordline of TLC memory has three logic pages: an MSB page, a center significant bit (CSB) page, and an LSB page. A wordline of QLC memory has four logic pages: an MSB page, a center most significant bit (CMSB) page, a center least significant bit (CLSB) page, and an LSB page. Different types of pages of a memory device have different read threshold voltages as described above. Therefore, different types of pages have different fail-bit distributions as shown in FIG. 5.

Figure 5:
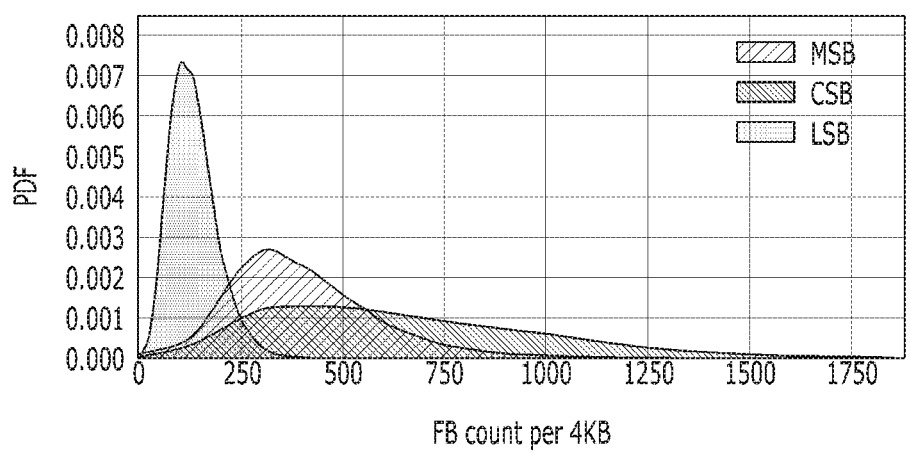
FIG. 5 is a diagram illustrating fail-bit distributions of different pages in a memory device.

FIG. 5 is a diagram illustrating fail-bit distributions for different types of pages in a memory device, for example, a triple-level cell (TLC) NAND flash memory device.

Referring to FIG. 5, the X-axis represents the number of bits that failed during decoding, i.e., fail-bit (FB) counts, per page (e.g., 4 KB of data) and the Y-axis represents probability distribution function (PDF) for fail-bit counts. Each of MSB, CSB and LSB pages of the TLC NAND flash memory has different fail-bit distributions as shown in FIG. 5. Further, fail-bit distributions may vary based on the current state of the TLC NAND flash memory or a memory system including the TLC NAND flash memory within its life cycle or life span.

Figure 6:
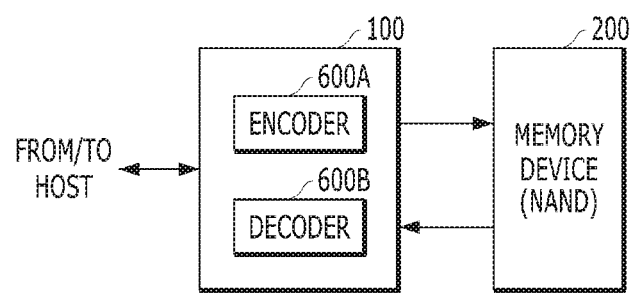
FIG. 6 is a diagram illustrating a memory system in accordance with an embodiment of the present invention.

FIG. 6 is a diagram illustrating a memory system in accordance with an embodiment of the present invention.

Referring to FIG. 6, the memory system may include a controller 100 and a memory device 200. The memory device 200 may include a NAND flash memory device with memory cells such as single-level cells (SLCs), multi-level cells (MLCs), triple-level cells (TLCs) and/or quadruple-level cells (QLCs). In various embodiments, the memory device 200 may include a NAND type flash memory device with TLC memory cells (TLCs) or QLC memory cells (i.e., QLCs).

The controller 100 may receive a command from a host, and provide the memory device 200 with the received command. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command. The controller 100 transmits read data corresponding to the read command to the host.

The controller 100 may include an encoder 600A, and a decoder 600B. During the program operation, the encoder 600A may perform an encoding operation on the write data based on a set encoding scheme. During the read operation, the decoder 600B may perform a decoding operation on the read data based on a set decoding scheme corresponding to the encoding scheme. The controller 100 and the memory device 200 may perform the operations described in FIGS. 1 and 2. In an embodiment, the encoder 600A and decoder 600B may be embodied in the ECC component 130 of the controller 100 shown in FIG. 2. Other suitable arrangements may be employed as well, as explained below. In general, the encoder 600A and decoder 600B may be implemented by hardware, software, firmware, or any suitable combination thereof.

The decoder 600B may perform a decoding operation based on various codes such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). In various embodiments, the decoder 6006 may be implemented with a LDPC decoder using an LDPC code. LDPC code is a family of linear block forward error-correction (ECC) code whose parity check matrix may be represented by a low density parity check matrix. LDPC code provides excellent error correction performance.

The decoder 6006 (e.g., a LDPC decoder) may have some parameters which are used to tune a decoding algorithm to achieve the best error correction performance. These parameters may depend on not only a structure of a parity check matrix, but also failed-bit distributions, raw bit error rates (BERs) and other factors. Therefore, when a decoding algorithm is applied to data from different logic pages of the memory device 200, optimal parameters for a certain type of page (e.g., an MSB page) may be different from those for other types of pages (e.g., CSB and LSB pages). Further, the optimal parameters for a certain type of page may vary based on the current state of the memory device 200 in its life cycle. For example, optimal parameters for an MSB page at the beginning of the life of the memory device 200 may be different from the optimal parameters for the MSB page at the end of the life of the memory device 200.

In various embodiments, the decoder 600B may obtain a type of the page in which the received data is stored, i.e., page type. For example, the decoder 600B obtains page type information identifying the type of the page where the data was stored. The page type information may be extracted from a read command. Further, the decoder 600б may obtain information regarding failed-bit distributions and/or raw bit error rates (BERs) for the types of pages respectively. Such information may be derived or obtained from previous decoding results. Based on the page type, and information regarding failed-bit distribution and/or raw BER for that page type, the decoder 600B may select a parameter group among a plurality of parameter groups and perform a decoding procedure based on parameters of the selected parameter group.

Figure 7:
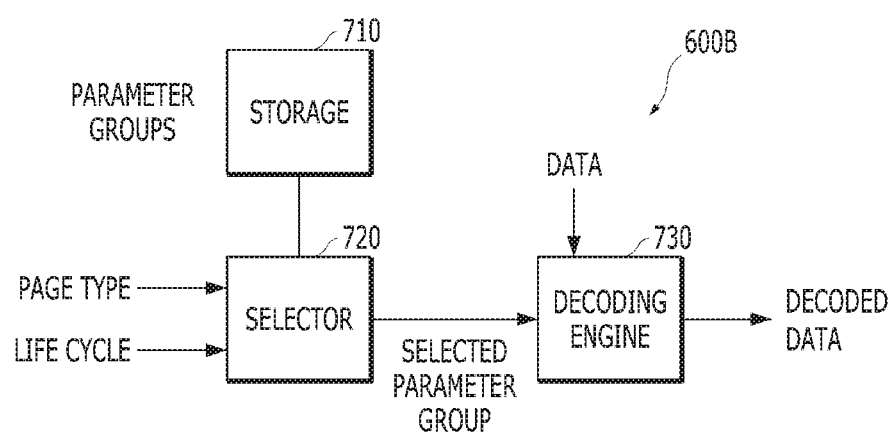
FIG. 7 is a diagram illustrating a decoder in accordance with an embodiment of the present invention.

FIG. 7 is a diagram illustrating a decoder in accordance with an embodiment of the present invention. For example, the decoder of FIG. 7 may depict the decoder 600B shown in FIG. 6.

Referring to FIG. 7, the decoder 600B may include a storage 710, a selector 720 and a decoding engine 730. The decoding engine 730 may receive data and decode the received data to generate decoded data. Further, the decoding engine 730 may perform a decoding operation on the read data based on a decoding scheme (e.g., a low density parity check (LDPC) scheme).

In various embodiments, the decoding engine 730 may receive read data from a memory device (e.g., the memory device 200 of FIG. 6). The memory device 200 may include a plurality of memory cells, such as triple-level cells (TLCs) or quadruple-level cells (QLCs), defining logic pages as described above. In a memory device implemented with TLCs, the types of pages may include a most significant bit (MSB) page, a center significant bit (CSB) page, and a least significant bit (LSB) page. In a memory device implemented with QLCs, the types of pages may include an MSB page, a center most significant bit (CMSB) page, a center least significant bit (CLSB) page, and an LSB page.

Figure 8:
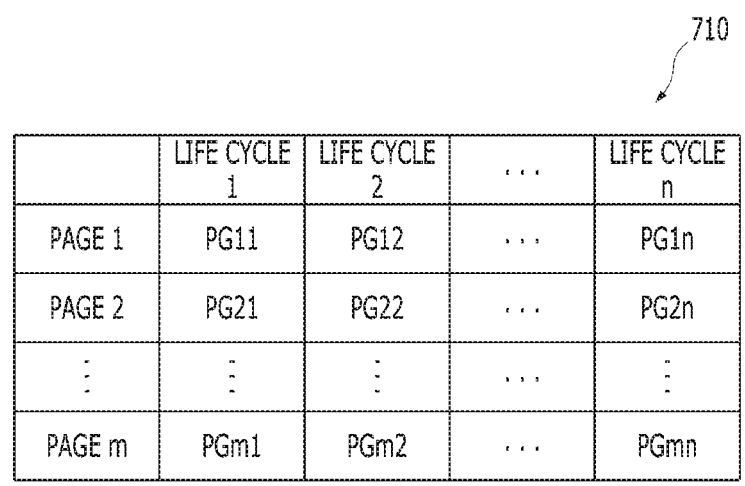
FIG. 8 is a diagram illustrating a storage in accordance with an embodiment of the present invention.

FIG. 8 is a diagram illustrating a storage in accordance with an embodiment of the present invention. For example, the storage of FIG. 8 may depict the storage 710 shown in FIG. 7.

Referring to FIG. 8, the storage 710 may store a plurality of parameter groups PG11 to PGmn for a decoding scheme (e.g., a low density parity check (LDPC) scheme). The plurality of parameter groups PG11 to PGmn may include (m×n) parameter groups with reference to m page types and n time points in the life cycle of the memory device 200.

A parameter group PG11 corresponds to the combination of a first page type PAGE1 and a first time point in the life cycle LIFE CYCLE1, a parameter group PG12 corresponds to the combination of the first page type PAGE1 and a second time point in the life cycle LIFE CYCLE2, and a parameter group PG1n corresponds to the combination of the first page type PAGE1 and a n-th time point in the life cycle LIFE CYCLEn. A parameter group PG21 corresponds to the combination of a second page type PAGE2 and the first time point in the life cycle LIFE CYCLE1, a parameter group PG22 corresponds to the combination of the second page type PAGE2 and the second time point in the life cycle LIFE CYCLE2, and a parameter group PG2n corresponds to the combination of the second page type PAGE2 and a n-th time point in the life cycle LIFE CYCLEn. A parameter group PGm1 corresponds to the combination of a m-th page type PAGEm and the first time point in the life cycle LIFE CYCLE1, a parameter group PGm2 corresponds to the combination of the m-th page type PAGEm and the second time point in the life cycle LIFE CYCLE2, and a parameter group PGmn corresponds to the combination of the m-th page type PAGEm and the n-th time point in the life cycle LIFE CYCLEn.

In an embodiment, m is 3, representing 3 different page types: an MSB page, a CSB page, and an LSB page. Alternatively, in another embodiment, m may be 4, representing 4 different page types: an MSB page, a CMSB page, a CLSB page, and an LSB page.

In an embodiment, n is 3, representing 3 time points in a life cycle or lifespan of the memory device 200: beginning, middle and end of the memory device 200. Alternatively, n may be 4 or more, representing 4 or more time points in a life cycle, which may be suitable points within a life cycle, with adjacent time points being separated by months or years depending on the total life cycle.

In various embodiments, each parameter group may include at least one decoding parameter. For example, the decoding parameter may include an iteration number of decoding. For another example, the decoding parameter(s) may include data length, code rate (i.e., ratio of data input to data output) used in the encoding and decoding processes, and/or log-likelihood ratio (LLR) values used for decisions in decoding. For another example, the decoding parameter(s) may include scaling factors, initial LLR setting and decoding retry number.

Referring back to FIG. 7, the selector 720 may select one parameter group among a plurality of parameter groups, which is stored in the storage 710. In various embodiments, the selector 720 may select a parameter group based on a page type of data and life cycle information. For example, information regarding the page type may be extracted from a read command. When the data is read from a memory device including memory cells such as triple-level cells (TLCs), the page type may be an MSB page, a CSB page, or an LSB page. In various embodiments, the life cycle information may include error information such as failed-bit distributions and raw bit error rates for the types of pages respectively. The life cycle information may be obtained based on previous decoding results of the decoding engine 730. In other words, the selector 720 may select an optimal parameter group among the plurality of parameter groups, based on the page type of data and life cycle information including failed-bit distributions and raw bit error rates. Further, the selector 720 may output the selected parameter group.

The decoding engine 730 may receive data and decode the received data using the selected parameter group by the selector to generate decoded data. Further, the decoding engine 730 may perform a decoding operation on the read data based on a low density parity check (LDPC) scheme.

Figure 9:
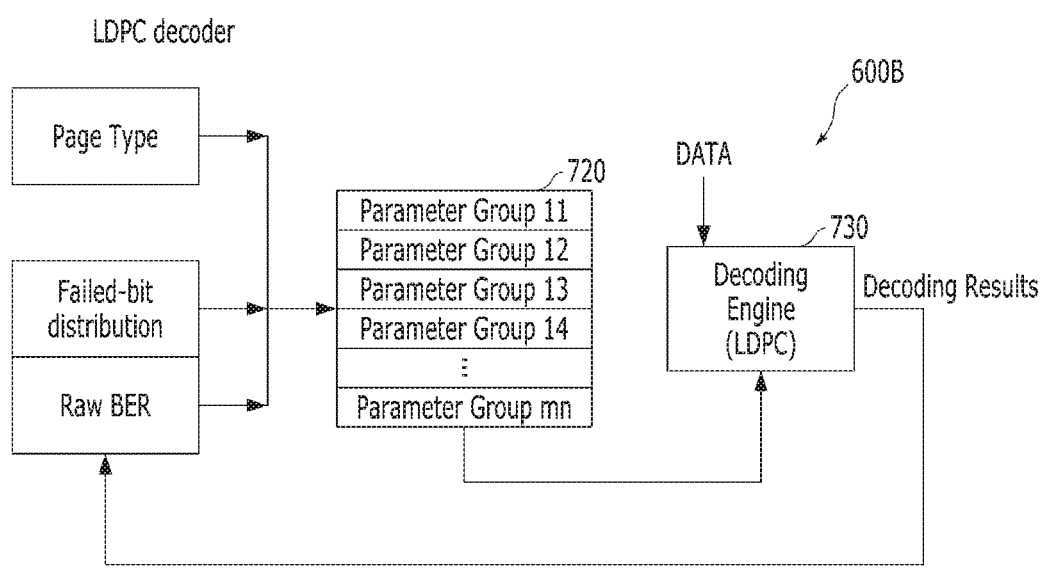
FIG. 9 is a diagram illustrating a low density parity check (LDPC) decoder in accordance with an embodiment of the present invention.

FIG. 9 is a diagram illustrating a low density parity check (LDPC) decoder in accordance with an embodiment of the present invention. For example, the LDPC decoder of FIG. 9 may depict an embodiment of the decoder 600B shown in FIG. 7, which includes the decoding engine 730 embodied by an LDPC decoding engine.

Referring to FIG. 9, the LDPC decoder 600B may include a selector 720 and a decoding engine 730. The selector 720 may select one parameter group among a plurality of parameter groups 11 to mn. The selector 720 may select a parameter group based on a page type of data and life cycle information.

For a memory device implemented with TLCs, the page type may be one of an MSB page, a CSB page, and an LSB page. For a memory device implemented with QLCs, the page type may be one of an MSB page, a CMSB page, a CLSB page and an LSB page.

In various embodiments, the life cycle information may include error information such as failed-bit distributions and raw bit error rates. The life cycle information may be obtained based on previous decoding results of the decoding engine 730. In other words, the selector 720 may select an optimal parameter group, among the plurality of parameter groups, based on the page type of data and life cycle information including failed-bit distribution and/or raw bit error rate for that type of page. Further, the selector 720 may output the selected parameter group to the decoding engine 730.

The decoding engine 730 may receive data and decode the received data using the selected parameter group to generate decoded data. Further, the decoding engine 730 may perform a decoding operation on the read data based on an LDPC scheme.

Figure 10:
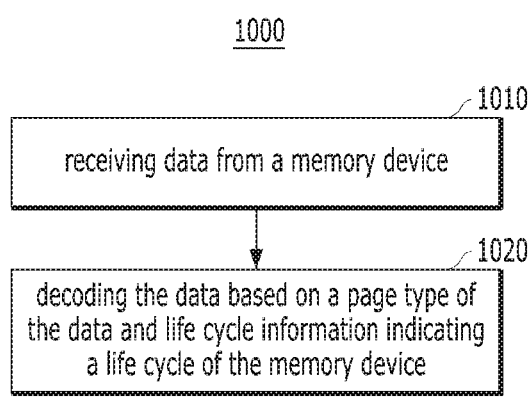
FIG. 10 is a flowchart illustrating an operation of a decoder in accordance with an embodiment of the present invention.

FIG. 10 is a flowchart illustrating an operation 1000 of a decoder in accordance with an embodiment of the present invention. For example, the operation 1000 of FIG. 10 may be performed by the decoder 600B of FIG. 7.

Referring to FIG. 10, the operation 1000 may include a step 1010 of receiving data from a memory device and a step 1020 of decoding the data based on a page type of the data (i.e., a type of a page in which the data is stored) and life cycle information indicating a life cycle of the memory device (i.e., a current state of the memory device in its life cycle).

In various embodiments, the step 1020 may include selecting one of a plurality of parameter groups based on the page type and the life cycle information and decoding the data using the selected parameter group to generate decoded data.

In various embodiments, the step 1020 may include decoding the data based on a low density parity check (LDPC) scheme.

In various embodiments, the page type includes one of a most significant bit (MSB) page, a center significant bit (CSB) page and a least significant bit (LSB) page.

In various embodiments, the life cycle information includes error information such as one of failed-bit distributions and raw bit error rates.

In various embodiments, the life cycle information is obtained previous decoding results.

In various embodiments, each of the plurality of parameter groups includes a number of iterations of decoding to be performed.

As described above, the decoder, in accordance with embodiments, may perform a decoding operation using an optimal parameter group selected from among a plurality of parameter groups based on a page type of data and life cycle information pertaining to the memory device. Through the optimal parameter group, the decoding operation may improve error correction performance, reduce the average number of iterations needed to successfully decode data using various decoding algorithms and consequently reduce decoding latency of a decoder.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A system comprising:
   a memory device including a plurality of pages, each storing data and being of a specific type; and
   a controller storing a plurality of parameter groups, each group being associated with a specific type of page at a particular state of the memory device, the controller including a decoder suitable for receiving data from the memory device, wherein the controller selects a parameter group from the plurality of parameter groups based on the specific type of page in which the data is stored and a current state of the memory device and decodes the data using the selected parameter group, and wherein each of the plurality of parameter groups includes a number of iterations of decoding to be performed.

2. The system of claim 1, wherein the decoder includes:
   a selector suitable for selecting the parameter group associated with the page in which the data is stored; and
   a decoding engine suitable for decoding the data using the selected parameter group to generate decoded data.

3. The system of claim 2, further comprising:
   a storage suitable for storing the plurality of parameter groups.

4. The system of claim 2, wherein the decoding engine decodes the data based on a low density parity check (LDPC) scheme.

5. The system of claim 1, wherein the specific types of pages include a most significant bit (MSB) page, a center significant bit (CSB) page and a least significant bit (LSB) page.

6. The system of claim 1, wherein the current state of the memory device is determined based on time-based error information.

7. The system of claim 6, wherein the time-based error information includes one of failed-bit distributions and raw bit error rates for the specific type of page.

8. The system of claim 6, wherein the time-based error information is obtained from previous decoding results.

9. The system of claim 1, wherein the current state of the memory device includes one of beginning of life, middle of life and end of life.

10. A method for operating a system including a memory device, which includes a plurality of pages, each storing data and being of a specific type, the method comprising:
    receiving data from the memory device;
    selecting a parameter group from among a plurality of parameter groups based on the specific type of page in which the data is stored and a current state of the memory device; and
    decoding the data using the selected parameter group,
    wherein each of the parameter groups is associated with a specific type of page at a particular state of the memory device, and
    wherein each of the plurality of parameter groups includes a number of iterations of decoding to be performed.

11. The method of claim 10, wherein the decoding of the data includes:
    decoding the data using the selected parameter group to generate decoded data.

12. The method of claim 10, wherein the decoding of the data includes decoding the data based on a low density parity check (LDPC) scheme.

13. The method of claim 10, wherein the specific types of pages include a most significant bit (MSB) page, a center significant bit (CSB) page and a least significant bit (LSB) page.

14. The method of claim 10, wherein the current state of the memory device is determined based on time-based error information.

15. The method of claim 14, wherein the time-based error information includes one of failed-bit distributions and raw bit error rates for the specific type of page.

16. The method of claim 14, wherein the time-based error information is obtained from previous decoding results.

17. The method of claim 10, wherein the current state of the memory device includes one of beginning of life, middle of life and end of life.

* * * * *